United States Patent [19]
Mathieu

[11] Patent Number: 6,090,261
[45] Date of Patent: Jul. 18, 2000

[54] METHOD AND APPARATUS FOR CONTROLLING PLATING OVER A FACE OF A SUBSTRATE

[75] Inventor: Gaetan L. Mathieu, Livermore, Calif.

[73] Assignee: FormFactor, Inc., Livermore, Calif.

[21] Appl. No.: 09/083,206

[22] Filed: May 21, 1998

Related U.S. Application Data

[63] Continuation-in-part of application No. 08/452,255, May 26, 1995, abandoned.

[51] Int. Cl.$^7$ ............................... B05D 3/04; B05D 1/02; B05D 5/12; C25D 5/00; C25D 9/04
[52] U.S. Cl. ....................... 205/137; 427/421; 427/425; 427/98; 427/304; 205/915; 205/920
[58] Field of Search ..................................... 427/421, 425, 427/304, 98; 205/137, 915, 920

[56] References Cited

U.S. PATENT DOCUMENTS

| 4,137,867 | 2/1979 | Aigo ........................................ 118/627 |
| 4,304,641 | 12/1981 | Grandia et al. ............................ 204/23 |
| 4,633,804 | 1/1987 | Arii ........................................... 118/52 |
| 5,445,172 | 8/1995 | Thompson et al. ....................... 134/153 |

*Primary Examiner*—Kathryn Gorgos
*Assistant Examiner*—Edna Wong
*Attorney, Agent, or Firm*—Blakely, Sokoloff, Taylor & Zafman

[57] ABSTRACT

According to aspect of the invention, a plating system is provided which includes a tank for containing a plating solution, a shaft extending into the tank, and a substrate holder mounted to the shaft. The shaft and the tank are rotatable relative to one another. The substrate holder is configured to support a substrate in position so that at least a first face of the substrate is exposed to the plating solution in the tank.

25 Claims, 9 Drawing Sheets

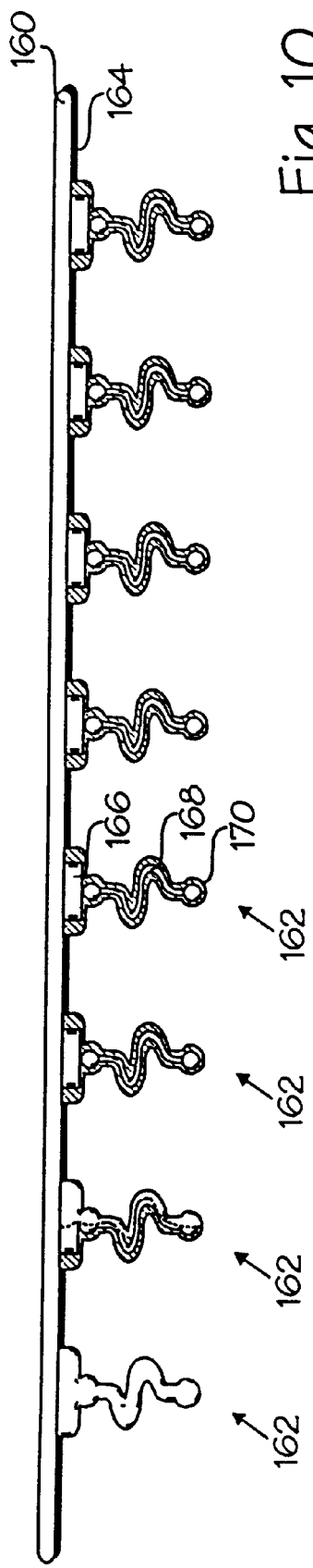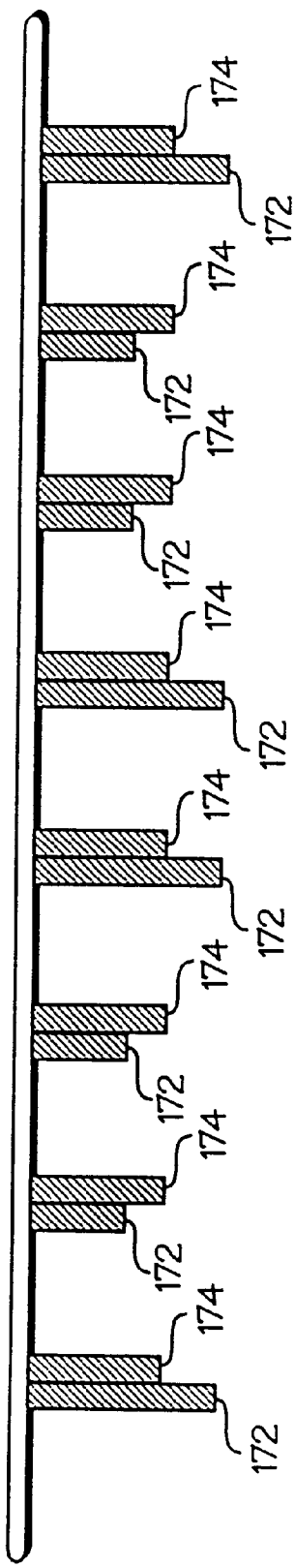

METHOD AND APPARATUS FOR CONTROLLING PLATING OVER A FACE OF A SUBSTRATE

This patent application is a continuation-in-part of U.S. patent application Ser. No. 08/452,255 which was filed on May 26, 1995 now abandoned.

BACKGROUND OF THE INVENTION

1). Field of the Invention

The present invention relates generally to a method and an apparatus for plating onto a substrate. More specifically, the present invention relates to a method and apparatus for controlling thickness of plating over a width of a substrate. In particular, the present invention relates to a method and apparatus for counteracting non-uniform plating over a width of a face of a substrate.

2). Discussion of Related Art

Plating techniques are widely known in the art and are used for a wide variety of purposes. In the microelectronic industry, for example, electroplating and electroless plating techniques are used for plating layers on a face of a substrate or for forming individual structures on substrates, such as on semiconductor wafers during the manufacture of integrated circuits, on semiconductor dies, on printed circuit boards, and on various other active and non-active electrical components. For example, the manufacture of an integrated circuit on a wafer typically involves the formation of a pattern of metal lines on the wafer. The metal lines may be plated within trenches formed in a surface of the wafer. The metal lines may be formed utilizing an electroplating technique wherein a voltage is applied to a metal shorting layer in a base of the trenches. Previously, metal was plated which filled the trenches and covered the wafer, whereafter the metal would be planarized to leave a layer of metal lines in the trenches only. In order to do away with a planarization step, techniques were then developed wherein only the trenches were filled with metal without covering all of the wafer. Such a technique requires uniform plating over the entire width of the wafer so as to ensure uniform metal line thicknesses over the width of the wafer. However, for various reasons some of which will be discussed hereinbelow, uniform plating of a layer over a width of a wafer is often not easily accomplished.

In another example, individual contact structures known as controlled collapse chip connection (C4) bumps are formed on a wafer after an integrated circuit is formed in the wafer. The C4 bumps are used to mount the integrated circuit to a package substrate. The C4 bumps are formed by applying a voltage to individual bond pads on the wafer. In order to ensure C4 bumps of substantially equal height, as is required for mounting the integrated circuit to the package substrate, uniform plating over the width of the wafer is required. However, as mentioned, uniform plating over the width of the wafer may be difficult to obtain.

A number of factors may contribute to non-uniform plating over a face of a substrate. These factors may, for example, include the direction of flow of a plating solution over the face of the substrate, depletion of the plating solution, the positioning of an anode or a cathode which is used for plating, or current density variations over the face of the substrate, particularly current density edge effects around an edge of the substrate. Temperature is also a known factor which influences plating rate. Some of the influences that temperature may have on plating rate are discussed in more detail with respect to FIGS. 5G and 5H in the specification of U.S. patent application Ser. No. 08/452,255 filed May 26, 1995 now abandoned.

Typical problems associated with plating are discussed with reference to FIGS. 1, 2 and 3.

FIG. 1 illustrates a typical plating system 20 which may be used for plating on a lower face 22 of a substrate 24 such as a wafer or a printed circuit board.

The plating system 20 in the illustrated example comprises a tank 26, a substrate holder 28, a pump 30, and an electrical biasing device 32.

The substrate holder 28 locates the substrate 24 over an upper opening of the tank 26 so that the lower surface 22 of the substrate 24 faces downwardly into the tank 26. The tank 26 may be filled with a plating solution which contacts the lower face 22 of the substrate 24.

The electrical biasing device 32 is used for creating a voltage potential between the substrate 24 and the plating solution in the tank 26. By creating a voltage potential between the substrate 24 and the plating solution, a layer is plated on the lower face 22 of the substrate 24.

Due to depletion of the plating solution near the lower face 22 of the substrate 24, it may be necessary to continuously circulate the plating solution through the tank 26. The pump 30 is used to circulate the plating solution through the tank and over the lower face 22 of the substrate. The pump 30 supplies plating solution to a nozzle 34 in the bottom of the tank 26. The nozzle 34 then directs the plating solution upwardly and onto a central region 36 of the lower face 22 of the substrate 24. The plating solution then flows concentrically outwardly over an outer region 38 of the lower face 22 of the substrate 24, and then over an edge region 40 of the lower face 22 of the substrate 24. The plating solution then exists through multiple holes 42 near an edge of the substrate 24, from where the plating solution flows back to the pump 30.

FIG. 2 illustrates a typical profile of a plating layer 44 which is formed on the lower face of the substrate 24 when using a system such as illustrated in FIG. 1. The plating layer 44 is typically relatively thick on the central region 36 of the lower face 22 of the substrate 24. The plating layer 44 then decreases in thickness towards the outer region 38 on the lower face 22 of the substrate 24. The plating layer 44 then typically increases in thickness towards the edge region 40 of the lower face 22 of the substrate 24. The plating layer 44 may vary by 50% or more in thickness, depending on the particular plating system and substrate characteristics. A number of factors contribute to variations in thickness of the plating layer 44.

One factor which may contribute to a non-uniformity in thickness of the plating layer 44 deals with lack of agitation and subsequent replacement of the plating solution after the plating solution has become depleted. The lower face 22 of the substrate 24 is initially exposed to a concentration and chemical composition of the plating solution substantially the same as the plating solution throughout the tank 26. Once plating is initiated the plating solution near the substrate starts losing molecules to the plating layer 44 being formed. The result of the loss of molecules is that a thin boundary layer of depleted plating solution forms on the lower face 22 of the substrate 24. The effect of the boundary layer of depleted plating solution is that less plating occurs as what could be achieved with undepleted plating solution, thus reducing the rate of plating on the lower face 22 of the substrate 24.

A further complication is that the boundary layer does not form uniformly over the lower face 22 of the substrate 24 due to differential agitation of the boundary layer, thus resulting in non-uniform rates of plating over the face of the substrate. Non-uniform formation of the plating layer may be attributed to a number of factors, one of which is differences in agitation of the plating solution over the lower face 22 of the substrate 24.

For example, FIG. 3 illustrates schematically how the plating solution flows concentrically outwardly over the lower face of the substrate 24. The plating solution first flows through an area indicated by the small circle 46A and then through an area indicated by the large circle 46B. When flowing through the small area 46A, the plating solution has a relatively high velocity, indicated by the arrow 48A. However, due to the larger outer area 46B, the plating solution has a velocity, indicated by the arrow 48B, when flowing through the outer area 46B which is less than the velocity 48A when flowing through the inner area 46A. The velocity 48A may be sufficient to cause agitation of the plating solution after having become depleted to such a degree that a depleted boundary layer of the plating solution is continuously replaced with undepleted plating solution. However, the velocity 48B may be of a magnitude which is insufficient for purposes of causing sufficient agitation of the plating solution and may, correspondingly, cause less replacement of a depleted boundary layer of the plating solution. Less plating then, accordingly, occurs as the plating solution flows concentrically outwardly.

A further factor which may contribute to a non-uniformity in thickness of the plating layer 44 may deal with the electrical characteristics of the plating system 20. A higher current density tends to be created near a peripheral edge of the substrate 24. A higher current density, in turn, results in more plating near the peripheral edge of the substrate 24, thus accounting for the plating layer 44 being thicker on the edge region 40 of the lower face 22 of the substrate 24.

Yet a further complication to depletion of the plating solution and the subsequent formation of the boundary layer of depleted plating solution is that may contribute to variations in thickness of the plating layer 44 is depletion of the plating solution while flowing over the lower face 22 of the substrate 24. The plating solution is initially undepleted when flowing over the central region 36, thus accounting for the plating layer 44 being relatively thick on the central region 36. The plating solution then depletes as it flows towards the outer region 38 and the edge region 40, thus accounting for a reduction in thickness of the plating layer 44 on the outer region 38.

The above example illustrates merely some of the electroplating problems which may contribute to a plating layer having non-uniform thickness being formed. Various other factors may contribute to a plating layer being formed having a non-uniform thickness. These factors are not all discussed in detail herein. Suffice it to say that it is an object of the present invention to tailor thickness of plating over a width of a substrate and, more particularly, to ensure more uniform plating over a width of a substrate.

SUMMARY OF THE INVENTION

According to one aspect of the invention, a plating system is provided which includes a tank for containing a plating solution, a substrate holder, and a temperature control device. The substrate holder is configured to support a substrate in position so that at least a first face of the substrate is exposed to the plating solution in the tank. The temperature control device provides, selective control of temperature in various regions of the substrate during plating so as to control plating over the first face of the substrate.

The temperature control device may create a temperature gradient over a second face of the substrate opposing the first face. In one embodiment, the temperature control device includes at least first and second bladders locatable on the second face, each bladder having an inlet opening for allowing a fluid into the bladder and an outlet opening for allowing the fluid out of the bladder.

The plating system may include an inlet port for allowing plating solution into the tank, a nozzle, and an outlet port for allowing the plating solution out of the tank. The nozzle is in communication with the inlet port and directs flow of the plating solution onto the first face of the substrate. A plurality of outlets may be provided for allowing the plating solution out of the tank.

The plating system may be used for forming a plating layer on the first face of the substrate. By creating a temperature gradient over the substrate, the thickness of the plating layer near the substrate can be tailored according to requirement. In particular, the plating layers near the substrate may be tailored so as to be more uniform over the first face of the substrate. The temperature gradient can be created so that a region of the first face is either cooled or heated, wherein cooling of the region results in less plating and heating of the region results in more plating. Various regions of the first face may be heated or cooled to different degrees in order to create a plating with a thickness profile as required.

In particular, the plating system may be used for rigidifying a plurality of elongated components having ends which are connected to the first face of the substrate. By creating a temperature gradient over the substrate, a temperature differential can be created between different groups of the elongated components. Plating near the substrate can so be controlled between the elongate components or group of elongate components with respect to one another.

According to another embodiment of the invention, a plating system is provided which includes a tank for containing a plating solution, a shaft extending into the tank, and a substrate holder mounted to the shaft. The shaft and the tank are rotatable relative to one another. The substrate holder is configured to support a substrate in position so that at least a first face of the substrate is exposed to the plating solution in the tank.

The plating system may include an inlet port for allowing the plating solution into the tank, a nozzle, and an outlet port for allowing the plating solution out of the tank. The nozzle is in communication with the inlet port and directs flow of the plating solution onto the first face of the substrate. The nozzle preferably directs flow of the plating solution onto a first region of the first face of the substrate from where the plating solution flows over a second region of the first face, wherein the substrate holder is rotatable relative to the tank about an axis through the first region.

By rotating the shaft, and therefore the substrate, relative to the tank, flow of the plating solution between the first and second regions is altered. Specifically, the magnitude and direction of flow of the plating solution may be altered between the first and second regions. More specifically, flow of the plating solution between the first and second regions is altered by increasing a tangential component about the first region of flow of the plating solution.

The plating system may be used for rigidifying a plurality of elongated components having ends which are connected to a first face of a substrate. The plating solution may be directed onto a first region on the first face of the substrate, from where the plating solution flows over a second region of the first face. A layer may then be plated on each elongated component. Flow of the plating solution between the first and second regions may be altered as hereinbefore described. Specifically, flow may be altered by rotating the substrate.

BRIEF DESCRIPTION OF THE DRAWINGS

The invention is further described by way of examples with reference to the accompanying drawings wherein like reference numerals indicate like or similar components and wherein:

FIG. 10 is a partially sectioned side view of a structure comprising a substrate and a plurality of contact members, each of which is formed by securing an end of an elongate spring component to a bond pad on the substrate, and forming a respective plating layer over each bond pad and each elongate spring component;

FIG. 11 illustrates diagramatically in the form of a bar graph thicknesses near the substrate of the respective plating layers of FIG. 10, respectively without creating a temperature gradient over the substrate, and wherein a temperature gradient is created over the substrate so as to control the relative thicknesses of the plating layers;

DETAILED DESCRIPTION OF THE INVENTION

Systems and methods of plating on a substrate are described. One skilled in the art will appreciate that the present invention relates to tailoring or controlling plating over a face of a substrate.

In the following description, for purposes of explanation, numerous specific details are set forth in order to provide a thorough understanding of the present invention. It will be evident, however, to one skilled in the art, that the present invention may be practiced without these specific details.

For example, specific details are set forth regarding plating systems which may be used for carrying out a method according to the invention. One skilled in the art would appreciate that the methods of the present invention may be carried out using alternative plating systems which may incorporate alternative components.

Furthermore, examples are provided of plating on substrates which are generally found in the microelectronic industry, such as on wafers or printed circuit boards. It should be understood that the methods of the invention may also be carried out for plating on other substrates found in the microelectronic industry such as semiconductor dies and on other active and non-active electrical devices. Moreover, it should also be understood that the present invention is not limited to systems and methods for plating on substrates found in the microelectronic industry alone. The methods and systems of the invention may thus find application for plating on substrates, components and objects other than what are generally found in the microelectronic industry.

In the description that follows, various terms such as "upper", "lower", "central", "outer", "edge", "orthogonal" and other terms are used. These terms are used for purposes of illustrating and discussing the invention and should not be interpreted as restrictive of the present invention.

Various systems and methods according to the invention are now described in more detail.

Figure 1:
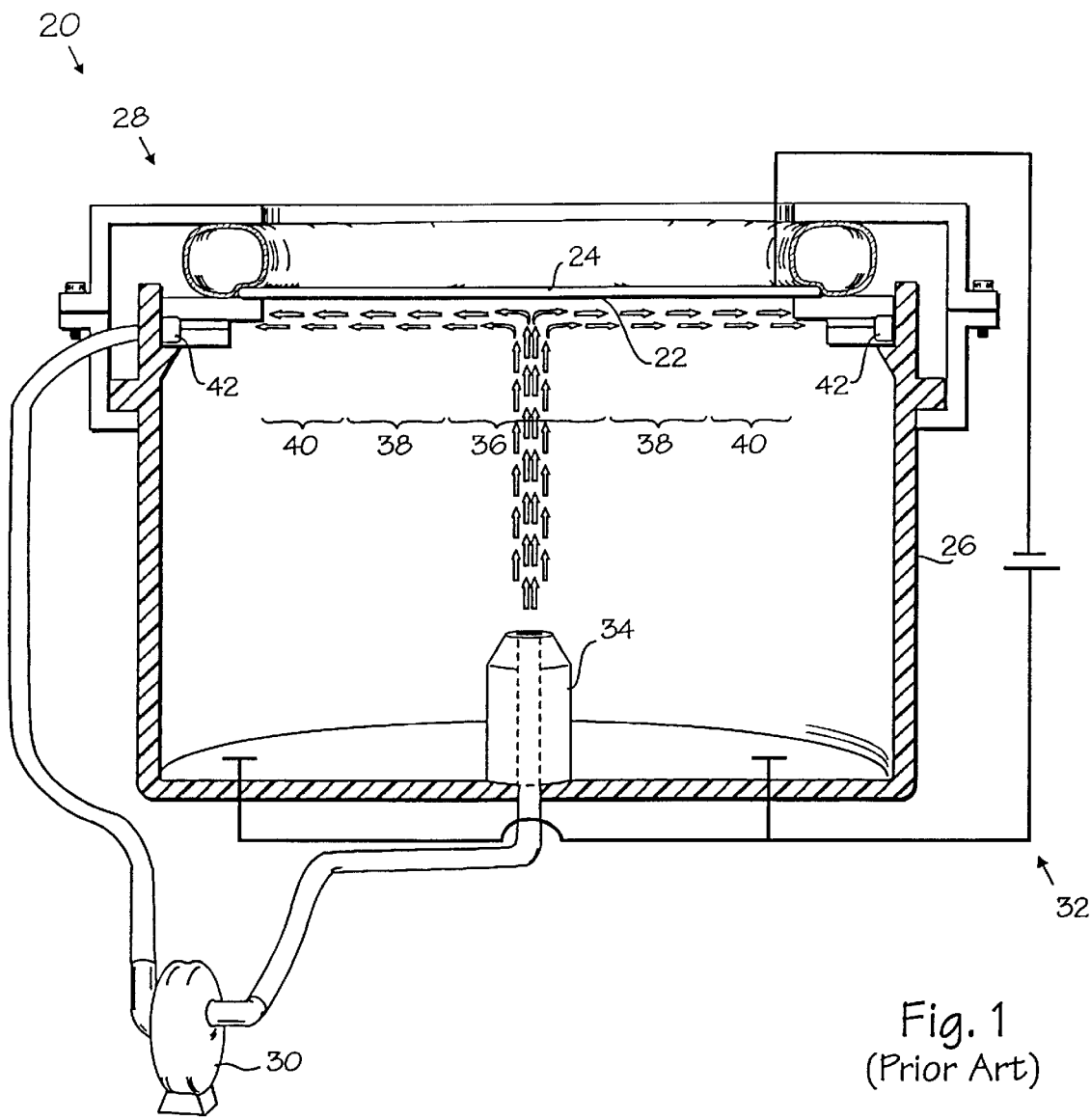
FIG. 1 is a sectioned side view of a prior art plating system which is used for plating on a face of a substrate such as on a wafer.
Figure 2:
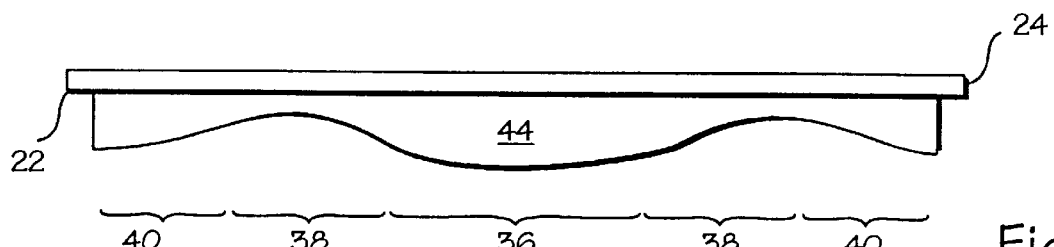
FIG. 2 is a sectioned side view of the substrate shown in FIG. 1 wherein a plating layer is formed on the face of the substrate, the plating layer having a thickness which varies over the face of the substrate.
Figure 3:
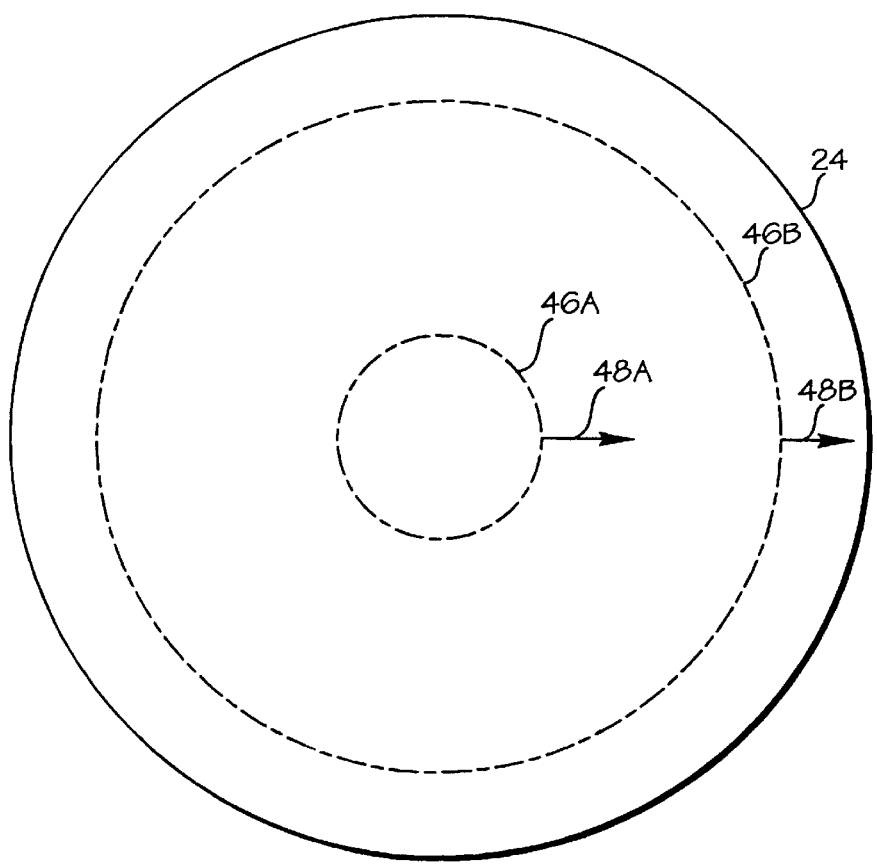
FIG. 3 is a view from below of the substrate of FIG. 1, illustrating concentric flow outwardly of the plating solution over the face of the substrate with a corresponding reduction in velocity of the plating solution.
Figure 4:
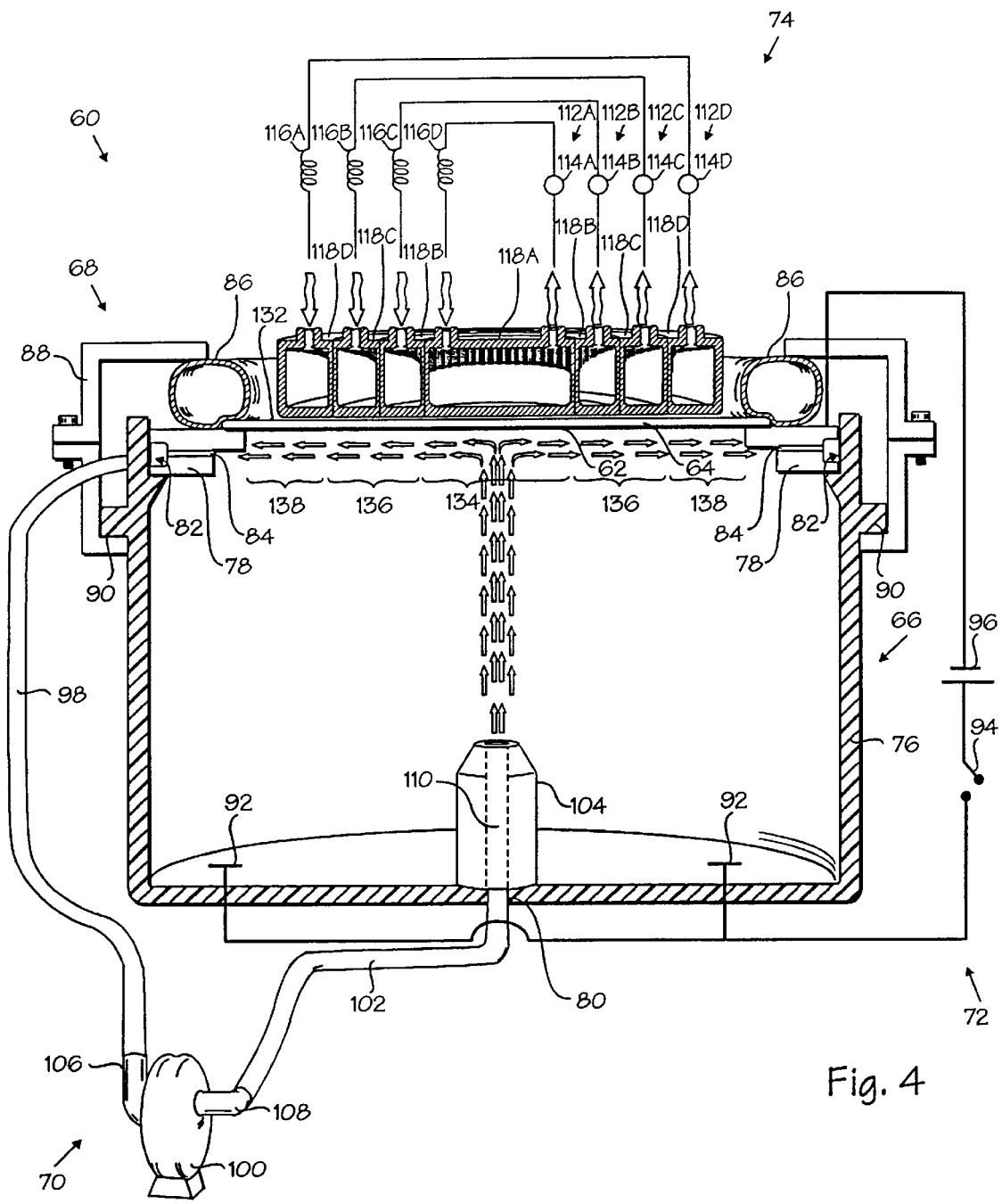
FIG. 4 is a sectioned side view of a plating system according to one embodiment of the invention wherein flow of a plating solution is directed onto a lower face of the substrate and an upper face of the substrate is selectively heated.

Controlling Plating Over a Face of a Substrate by Creating a Temperature Gradient FIG. 4 of the accompanying drawings illustrates a plating system 60 according to one embodiment of the invention which is used for plating on a lower face 62 of a substrate 64. For purposes of explanation, the plating system 60 of FIG. 4 is similar to the plating system 20 of FIG. 1. Should the plating system 60 of FIG. 4 therefore be used for forming a plating layer on the lower face 62 of the substrate 64, there will, for purposes of illustration and explanation of the invention, be a tendency for the plating layer to be formed with a variable thickness such as illustrated in FIG. 2. Other aspects of the plating system 60, in use, counteract the tendency for the plating layer to be formed as shown in FIG. 2.

The plating system 60 includes a tank 66 for containing a plating solution, a substrate holder 68 for positioning the substrate 64 so that the lower face 62 of the substrate 64 is exposed to the plating solution in the tank 66, a circulation apparatus 70 for circulating the plating solution through the tank 66 and over the lower face 62 of the substrate 64, an electrical biasing device 72, and a temperature control device 74.

The tank 66 includes a bucket 76 and a substrate seat 78 which is mounted inside a brim of the bucket 76. An inlet port 80 for allowing a plating solution into the tank 66 is formed centrally through a base of the bucket 76. A groove is formed in an outer surface of the substrate seat 78 so that a volute 82 is defined jointly by the groove and an inner surface of the bucket 76. An opening (not shown) is formed through the bucket 76 into the volute 82.

Multiple outlet ports 84 are formed into an inner surface of the substrate seat 78 and extend into the volute 82. Although only two of the outlet ports 84 are shown in cross section, it should be understood that the substrate seat 78 is in the form of a ring and that the outlet ports 84 are formed at multiple locations around a circumference of the substrate seat 78.

The substrate holder 68 includes an air bladder 86 and a clamp 88.

The air bladder 86 is tubular in shape and rests circumferentially on an upper surface of the substrate seat 78. The air bladder 86 can be inflated and deflated through a valve (not shown).

The clamp 88 is located over the air bladder 86 and a formation 90 on the bucket 76. Although a clamp is shown for purposes of securing the air bladder 86 to the tank 66, any other suitable device may be used for such a purpose.

The electrical biasing device 72 includes anodes 92 located in a base of the bucket and connected to the substrate seat 78 via an electrical switch 94 and a power supply 96 which are connected in series between the anodes 92 and the substrate seat 78. The substrate seat 78 provides an electrical connection to the substrate 64 to be plated which is the cathode in this embodiment.

The circulation apparatus 70 includes a first pipe 98, a pump 100, a second pipe 102, and a nozzle 104. The first pipe 98 has one end which is connected to the opening through the bucket 76 into the volute 82 and has an opposing end which is connected to a low pressure side of the pump 100.

The second pipe 102 has an end which is connected to a high pressure side 108 of the pump 100 and an opposing end which extends through the inlet port 80 into the bucket 76.

A passage 110 is formed through the nozzle 104. The nozzle 104 is connected to the end of the second pipe 102 extending through the inlet port 80 so that the passage 110 is in communication with the second pipe 102. The nozzle 104 is positioned so that the passage 110 extends substantially vertically through the nozzle 104.

The temperature control device 74 includes, for purposes of illustration, four temperature control circuits 112A, 112B, 112C and 112D.

Each temperature control circuit 112 A to D includes a respective pump 114A to D, a respective heat exchanger 116A to D, and a respective thermal bladder 118A to D.

Figure 5:
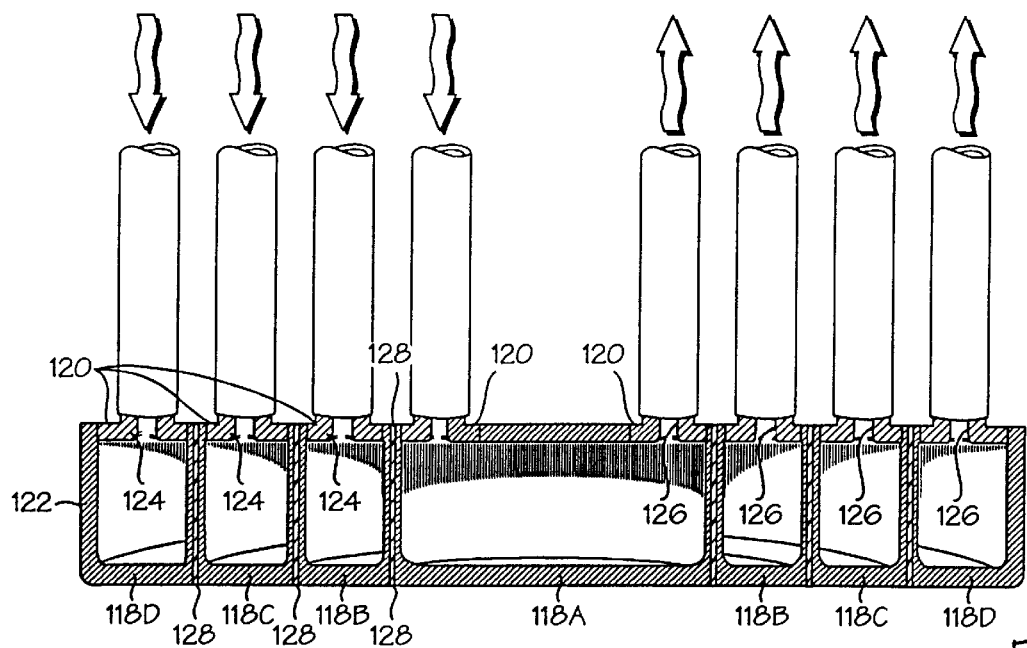
FIG. 5 is a partially sectioned side view of a series of thermal bladders forming part of the plating system of FIG. 4, the thermal bladders being located concentrically within one another.
Figure 6:
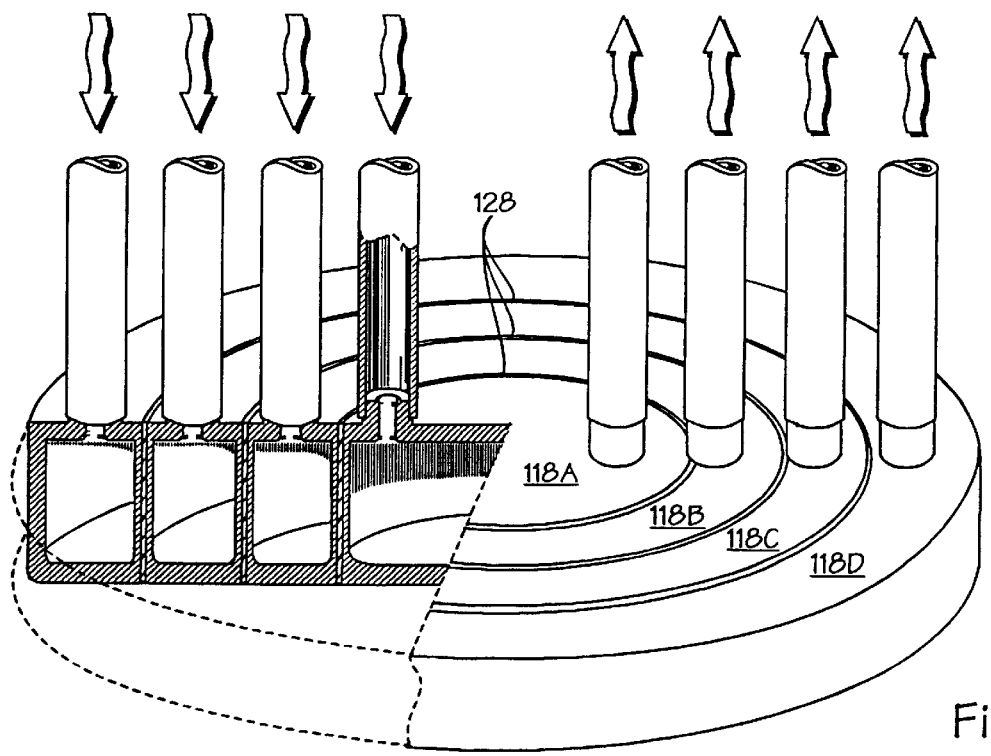
FIG. 6 is a partially sectioned perspective view of the bladders of FIG. 5.

Referring now to FIGS. 5 and 6, the assembly and configuration of the bladders 118 is shown in more detail. The bladder 118A has a circular shape and the bladders 118B, 118C and 118D have tubular shapes. The bladder 118B is located around the bladder 118A, the bladder 118C is located around the bladder 118B, and the bladder 118D is located around the bladder 118C.

Each bladder 118 comprises a mounting ring or mounting plate 120 and a tube 122 of a material such as neoprene rubber or the like which is secured to the mounting ring or mounting plate 120. Each bladder 118 is provided with an inlet nozzle 124 on one side of the respective mounting ring or mounting plate 120, and an outlet nozzle 126 on an opposing side of the mounting ring or mounting plate 120.

Circular gaskets 128 may be inserted between the bladders 118. The gaskets 128 serve to insulate the bladders 118 thermally from one another.

Referring again to FIG. 4, outlets of the pumps 114 are connected to inlets of the heat exchangers 116. Outlets of the heat exchangers are connected to the inlet nozzles 124 of the bladders 118. The outlet nozzles 126 of the bladders 118 are connected to inlets of the pumps 114.

In use of the plating system 60, the air bladder 86 is deflated and the substrate 64 is located on the substrate seat 78. The air bladder 86 is then inflated so that a surface of the air bladder 86 creates a pressure on an upper surface of the substrate seat 78 and on an edge of an upper face 132 of the substrate 64.

The tank 66 is then filled with a plating solution. Plating solutions which may be used are known in the art and are not described in detail herein. Filling of the tank 66 is continued until an upper surface of the plating solution contacts the lower face 62 of the substrate 64. The plating solution is prevented from escaping between the substrate 64 and the substrate seat 78 due to the pressure applied by the air bladder 86. The lower face 62 of the substrate 64 may have an area exposed to the plating solution having a cross-dimension of between 2.5 cm and 31 cm and may be of any shape, for example circular or rectangular.

The pump 100 is then operated so that the plating solution is circulated. The pump 100 receives the plating solution through the first pipe 98 and provides the plating solution through the second pipe 102 to the passage 110 in the nozzle 104. The nozzle 104 directs the plating solution upwardly through the tank 66 substantially orthogonally onto a central region 134 on the lower face 62 of the substrate 64. The plating solution is deflected against the lower face 62 of the substrate 64 and then flows concentrically outwardly over the lower face 62 of the substrate 64 over an outer region 136 of the lower face 62 and then over an edge region 138 of the lower face 62. The plating solution then exits the tank 66 through the outlet ports 84 and is collected in the volute 82. The plating solution then flows out of the tank and through the first pipe 98 back to the pump 100. The plating solution is so circulated through the tank 66 and over the lower face 62 of substrate 64. The plating solution may be circulated at a rate of between approximately 0.1 liters per minute and approximately 3 liters per minute. In various embodiments flow rates of between approximately 0 liters per minute and hundreds of liters per minute may be useful.

The temperature control circuits 112 are filled with a heat transfer medium. The heat transfer medium is preferably the same or similar to the plating solution used in the tank 66. Should any of the bladders 118 therefore leak and should the heat transfer medium somehow mix with the plating solution in the tank 66, the leaking heat transfer medium would not modify the chemical composition of the plating solution in the tank 66.

A device (not shown) maintains the tank temperature of the plating solution in the tank 66 at a predetermined temperature. The tank temperature of the plating solution may vary depending on specific application, and typically is in the range of between about 15° C. and about 95° C. In one implementation the temperature of the plating solution within the tank 66 is typically maintained at between 30° C. and approximately 55° C. The tank temperature of the plating solution is preferably maintained to within about a 1° C. tolerance range.

In the embodiment shown in FIG. 4, the bladder 118A is located on an area of the upper face 132 of the substrate 64 opposing the central region 134 of the lower face 62 of the substrate 64, the bladders 118B and 118C are located on an area of the upper face 132 of the substrate 64 opposing the outer region 136 of the lower face 62 of the substrate 64, and the bladder 118D is located on an area of the upper face 132 of the substrate 64 opposing the edge region 138 of the lower face 62 of the substrate 64.

The pumps 114 circulate the heat transfer medium through the heat exchangers 116 and through the bladders 118. Heat may be transferred to or away from the heat exchanges 116 individually. The heat transfer medium in the respective temperature control circuits 112 can so be individually heated or cooled. The temperature in one area of the upper face 132 of the substrate 62 may so be maintained at approximately a first level and another area of the upper face 132 may be maintained at a second level which may be different from the first level.

For example, the heat transfer medium in all of the temperature control circuits 112 may be heated. The heat transfer mediums in the circuits 112 may, in addition, be heated to different temperatures.

Alternatively, the heat transfer mediums within the circuits 112 may all be cooled. The heat transfer mediums within the circuits may, in addition, all be cooled to different temperatures.

Alternatively, the heat transfer medium in one or more of the heat transfer circuits 112 may be heated while the heat transfer medium in one or more of the other heat transfer circuits 112 may be cooled.

The heat transfer medium then flows from the heat exchangers 116 through the bladders 118. The bladders 118 can so be maintained at different selected temperatures.

The switch 94 of the electrical biasing device 72 is then closed so that a voltage is created between the substrate 64 and the anodes 92. By creating the voltage, a plating layer is formed on the lower face 62 of the substrate 64. Due to various reasons which are discussed in the preamble of this specification, the plating layer will tend to have a profile in cross section as illustrated by the dotted line 142 in FIG. 8. The plating layer will therefore tend to form thicker in the central region 134, thinner in the outer region 136 and thicker in the edge region 138.

Since the heat transfer medium in the respective temperature control circuits 112 are maintained at different temperatures, the temperatures of each transfer medium within the respective bladders 118 are also maintained at different temperatures with respect to one another. The bladders 118 transfer heat between the respective areas, referred to, of the upper face 132 of the substrate 64. Since the heat transfer medium within the bladders are at different temperatures, the bladders 118 may transfer heat differently to and from the upper face 132 of the substrate 64. A temperature gradient may so be created over the upper face 132.

The substrate 64 is typically of thin sheet material and relatively conductive so that the temperature gradient on the upper face 132 is closely reflected on the lower face 62 of the substrate 64. In certain cases there might be a transition of a few degrees between the upper face 132 and the lower face 62. By creating a temperature gradient on the lower face 62 of the substrate 64, the rate at which the plating layer forms on the lower face 62 may be tailored over the width of the lower face 62 of the substrate 64. In particular, the tendency for the plating layer to form non-uniformly over the lower face 62 of the substrate 64 may be counteracted so that the plating layer forms more uniformly over the width of the lower face 62 of the substrate 64. The temperatures of the adjacent bladders may vary by between 0° C. and about 25° C. Should, for example, the substrate 64 only be heated then all the bladders may be maintained at between about 0° C. and about 25° C. above the temperature of the temperature plating solution tank 66. In another example one or more of the bladders are maintained at between about 0° C. and about 12° C. above the temperature of the plating solution in the tank 66 and one or more of the bladders are maintained at a temperature of between about 0° C. and 12° C. below the temperature of the plating solution in the tank. One skilled in the art may through iterative experimentation obtain useful bladder temperatures in order to offset other factors which contribute to plating rate variations over a face of a substrate.

Due to heat transfer between the bladders 118 and the upper face 132, the heat transfer medium within the circuits 112 will also change in temperature while flowing through the bladders 118. The flow rates of the heat transfer medium through the bladders is preferably maintained at levels sufficiently high so that the temperature of the heat transfer medium typically changes by only a fraction of a degree Celsius while flowing through a respective bladder 118.

Figure 7:
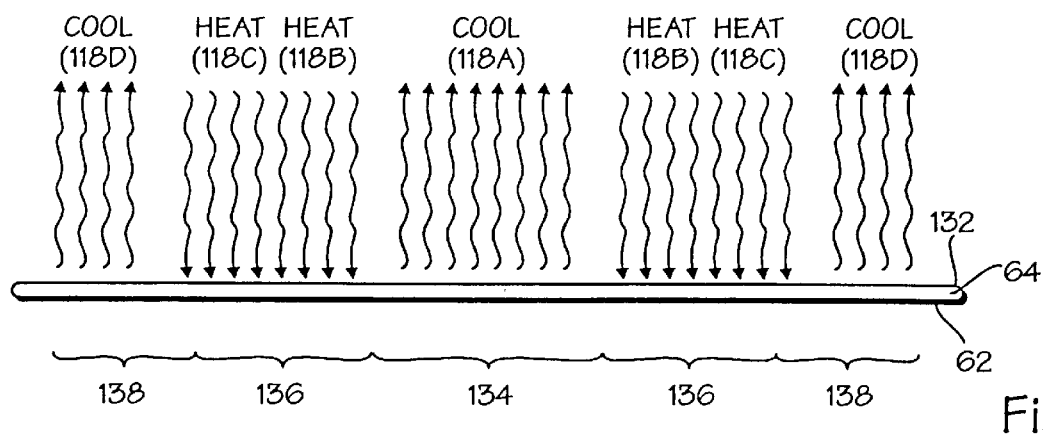
FIG. 7 is a sectioned side view of the substrate shown in FIG. 4, illustrating one possible manner of creating a temperature gradient, utilizing the temperature control bladders of FIGS. 5 and 6, for purposes of controlling plating on the substrate.
Figure 8:
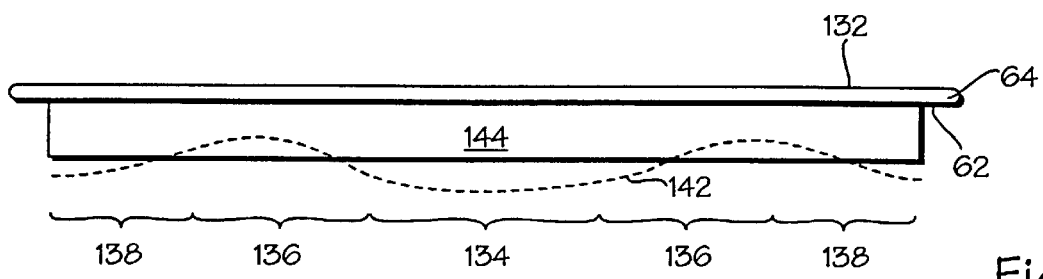
FIG. 8 is a sectioned side view of the substrate of FIG. 4 with a plating layer which is formed on the substrate while there is a temperature gradient is created over the substrate.

FIG. 7 illustrates how the tendency of the plating layer to form non-uniformly, as indicated by the dotted line 142 of FIG. 8, can be counteracted. The heat transfer medium flowing through the bladder 118A may be cooler than the temperature of the plating solution within the tank 66 so that an area of the upper face 132 opposing the central region 136 is cooled. The temperature of the central region 134 is, correspondingly, lowered. By lowering the temperature of the central region 134, less plating occurs on the central region 134.

Similarly, the heat transfer medium within the bladders 118B and 118C may be warmer than the plating solution within the tank 66 so that an area of the upper face 132 opposing the outer region 136 of the lower face 62 of the substrate 64 is heated. The temperatures of the bladders 118B and 118C may also be selected differently from one another. By heating an area of the upper face 132 of the substrate 64 opposing the outer region 136, the outer region 136 is also heated. By heating the outer region 136, more plating occurs on the outer region 136.

Similarly, the heat transfer medium in the bladder 118D may be lower than the temperature of the plating solution in the tank 66 so that the edge region 138 is cooled with correspondingly less plating on the edge region 138.

Referring now to FIG. 8, a plating layer 144 may be formed on the lower face 62 of the substrate 64 having a more uniform thickness. As shown in FIG. 8, for otherwise similar plating conditions, the thickness of the plating layer 144 is more or less equal to an average of the plating layer indicated by the dotted line 142. By altering heating or cooling to and from the substrate 64, the thickness of the plating layer 144 can also be controlled for plating during similar time frames.

Figure 9:
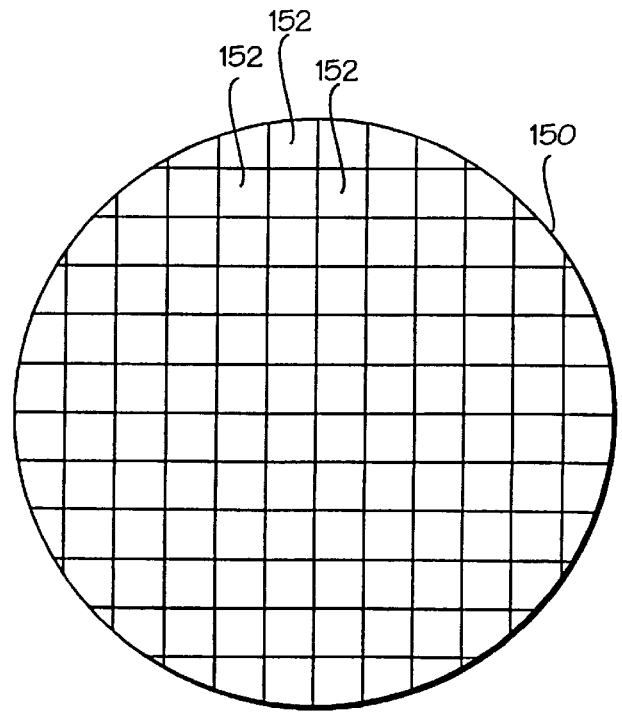
FIG. 9 is a plan view of a substrate, illustrating another method of creating a temperature gradient over the substrate wherein an array of contiguous Peltier tiles is utilized.

As mentioned previously, plating systems other than the plating system 60 of FIG. 4 may be used for plating on a substrate. In particular, another temperature control device than the temperature control device 74 of FIG. 4 may be used. For example, FIG. 9 illustrates a substrate 150 on which an array of contiguous Peltier tiles 152 are located. The Peltier tiles may be used for selectively heating or cooling localized areas of the substrate 150 so as to control plating on an opposing face of the substrate 150.

EXAMPLE 1

In one example a nickel cobalt sulphamate plating solution is used. The substrate has an area exposed to the plating solution of about 31 cm in diameter. The plating solution is circulated at a rate of 3 liters per minute. The plating solution is maintained at a temperature of 45° C. The temperature within the bladder 118A is maintained at about 42° C. The temperature in the bladder 118B is maintained at 49° C. The temperature in the bladder 118C is maintained at 49° C. The temperature in the bladder 118D, is maintained at 42° C. The resulting thickness of the plating layer is found to vary by less than 10%, depending on the particular substrate on which is plated (as opposed to about 50% when no temperature gradient is created).

As discussed hereinbefore, the plating system 60 may be used for controlling or tailoring the thickness of a layer formed over a face of the substrate. Such a substrate may, for example be a wafer on which a network of metal lines is plated, or a printed circuit board. The system 60 may alternatively be used for purposes of plating individual structures on a substrate. For example, the plating system 60 may be used for plating of C4 bumps on a wafer.

In another example, the plating system 60 may be used for forming a structure such as shown in FIG. 10 comprising a substrate 160 with a plurality of contact members 162 located on a face 164 of the substrate 160. Essentially, a number of bond pads are provided on the face 164 of the substrate 160. The elongate spring component 168 are secured to the bond pads either before or after the bond pads are finally formed, with each elongate spring component having an end which is secured to a respective bond pad 166. A plating layer 170 is then formed on each elongate spring component 168, thereby rigidifying the elongate spring components 168. The plating layers 170 may be formed utilizing the system 60 of FIG. 4. When heating the substrate 160, more plating occurs on the elongate spring components 168 near the substrate 160 than distant from the substrate. The formation of the contact members is described in more detail in U.S. patent application Ser. No. 08/452,255 which was filed on May 26, 1995, now abandoned which is hereby incorporated by reference and which is assigned to the same assignee as the assignee of the present patent application. Other contact structures may be formed according to different methods, as described in U.S. patent application Ser. No. 08/852,152 which was filed on May 6, 1997, pending and published under PCT No. WO97/43654, and in U.S. patent application Ser. No. 08/802,054 which was filed on Feb. 18, 1997, pending and published under PCT No. WO97/44676.

FIG. 11 is a bar graph illustrating the thicknesses of the plating layers 170 near the substrate 160 in various regions of the substrate when formed respectively according to a conventional method and when formed according to the method of the invention. When the plating layers 170 are formed according to the conventional method, the plating layers 170, near the substrate 160, tend to be thicker on some of the elongate spring components 168 than on others. The relative thicknesses may be illustrated by a first series of bars 172 on the graph of FIG. 11. Here the "horizontal position" represents the physical region of plating, while the vertical region of each bar represents plating thickness in the respective region.

When utilizing a plating system such as the plating system 60 of FIG. 4, a temperature gradient may be created over the face 164 of the substrate 160. By creating a temperature gradient over the face 164, the relative temperatures of the respective elongate spring components 168 may be altered relative to one another. A temperature differential or temperature differentials may so be created between different groups of the elongate spring components 168 relatively to one another. By creating a temperature differential between the elongate spring components 168 or groups of elongate spring components 168, the rate of plating near the substrate on the respective elongate spring components 168 may be controlled relative to one another. For example, the relative thicknesses of the respective plating layers may be altered so that the plating layers form more uniformly, with approximately equal thicknesses near the substrate as illustrated by the second series of bars 174 in FIG. 11.

The thickness of the respective plating layer 170 formed near the substrate 160 on the respective elongate spring component 168 is an important factor in the strength of the contact members 162. By controlling plating on each elongate spring component 168 so that the plating layers 170 are formed to similar thicknesses near the substrate 160 on all of the elongate spring components 168, the resulting contact members 162 tend to have similar strengths. Such a feature may be advantageous for the purpose that the structure of FIG. 10 is used.

Controlling Plating Over a Face of a Substrate by Controlling Flow of a Plating Solution Another manner of controlling or tailoring plating over a face of a substrate is by altering flow characteristics, and in particular, by altering the magnitude and direction of flow over a face of a substrate. The thickness of the plating layer formed on the face of a substrate may be controlled or tailored, or the respective thicknesses of individual structures such as C4 bumps or contact members such as the contact members shown in FIG. 10 may be controlled or tailored relative to one another.

Figure 12:
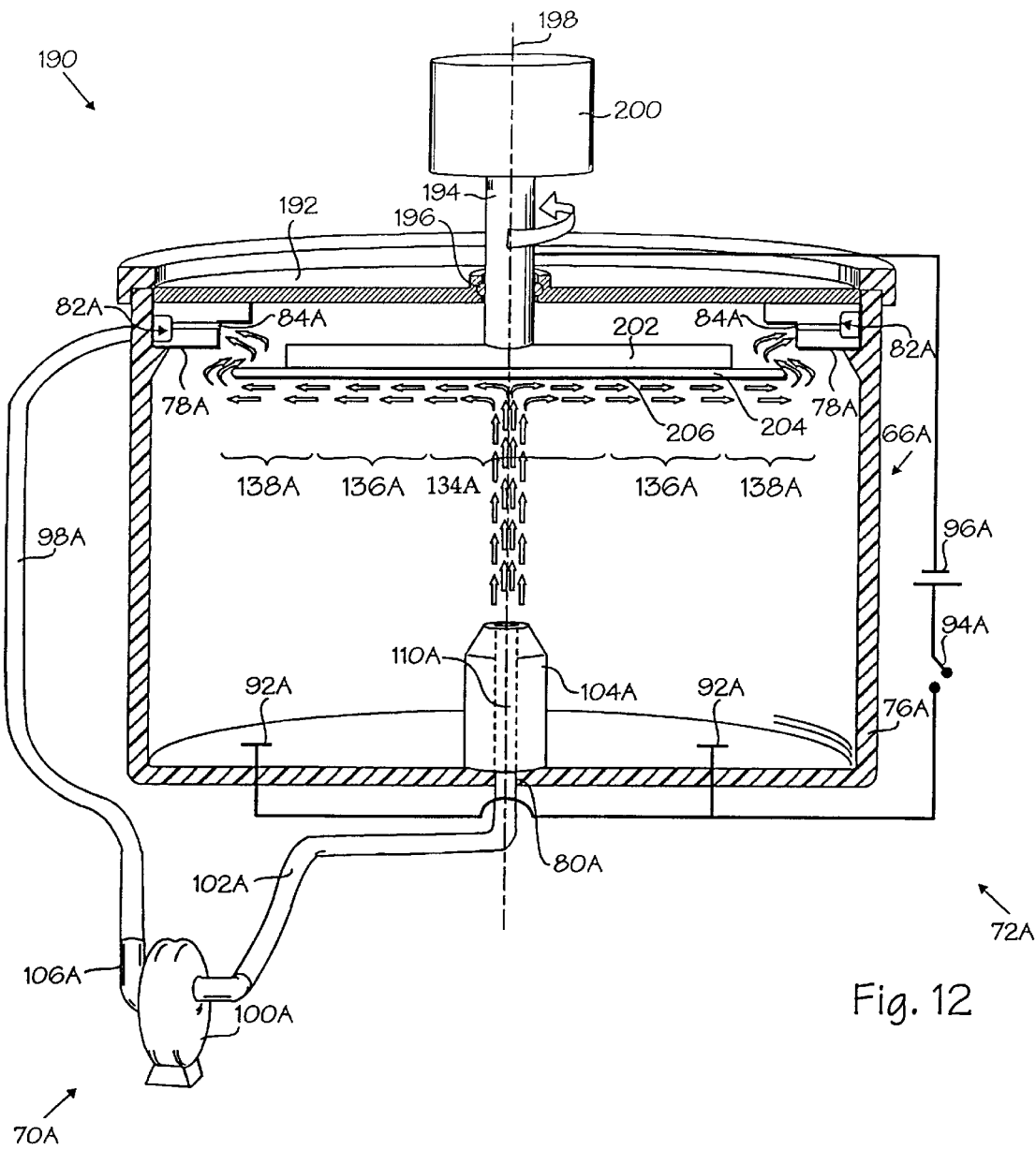
FIG. 12 is a sectioned side view of a plating system according to another embodiment of the invention wherein the direction and magnitude of flow of a plating solution over a substrate is altered by rotating the substrate.

FIG. 12 illustrates one plating system 190 which may be used in such a manner to control or tailor plating over a face of a substrate by altering flow characteristics over the face of the substrate. The plating system 190 of FIG. 12 is, for purposes of discussion, similar to the plating system 60 of FIG. 4 wherein like reference numerals indicate like or similar components or features. The plating system 190 therefore also includes a plating tank 66A for containing the plating solution, circulation apparatus 70A for the plating solution, and an electrical biasing device 72A. The plating tank 66A includes a bucket 76A having an inlet port 80A.

The circulation apparatus 70A also includes a first pipe 98A, a pump 100A, a second pipe 102A, and a nozzle 104A having a vertical passage 110A therethrough.

The electrical biasing device 72A also includes anodes 92A in a base of the tank 66A, an electrical switch 94A, and a power supply 96A.

A ring 78A, similar to the substrate seat 78 of FIG. 4, is located within a brim of the bucket 76A. A volute 82A is defined between opposing surfaces of the ring 78A and the bucket 76A and multiple outlet ports 84A are formed into the ring 78A.

The tank 66A further includes a lid 192 which is positioned on the brim of the bucket 76A. A rotatable shaft 194 extends downwardly through an opening 196 centrally located in the lid 192. The shaft 194 has a center line of rotation 198 which corresponds with a center line of the passage 110A of the nozzle 104A.

An upper end of the shaft 194 is coupled to an electric motor 200 which is used for rotating the shaft 194.

A substrate holder 202 is mounted to a lower end of the shaft 194. The substrate holder 202 may include an adhesive material or may be a vacuum chuck or any other device which is known in the art and which can be used for holding a substrate.

In use, the lid 192 is removed from the bucket 76A, together with the shaft 194, the electric motor 200 and the substrate holder 202. A substrate 204 is then secured to the substrate holder 202. The bucket 76A is then filled with a plating solution, at least to above the level of the outlet ports 84A. The lid 192 is then positioned on the bucket 76A so that the substrate 204 is immersed in substantially a horizontal position into the plating solution.

The pump 100A is then operated to circulate the plating solution through the tank and over a lower face 206 of the substrate 204, and the electric motor 200 is operated to rotate the shaft 194.

The plating solution is directed through the passage 110A onto a central region 134A of the lower face 206 of the substrate 204. The plating solution is deflected against the central region 134A and then flows concentrically outwardly over an outer region 136A and then over an edge region 138A of the lower face 206 of the substrate 204. The plating solution then curls around the substrate 204 and exits through the outlet ports 84A.

When the shaft 94 is rotated by the electric motor 200, the substrate 204 is also rotated. By rotating the substrate 204, the outer region 136A and the edge region 138A are rotated about the central region 134A.

A terminal of the power supply 96A is connected to the shaft 194. When the switch 94A is closed, a closed circuit is created between the lower face 206 of the substrate 204 and the plating solution in the tank 66A so that a plating layer is formed on the lower face 206 of the substrate 204.

Figure 13:
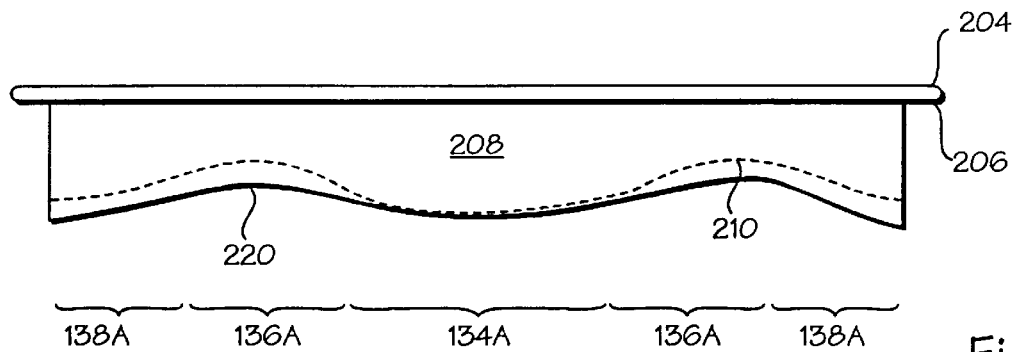
FIG. 13 is a sectioned side view of the substrate of FIG. 12, illustrating how a thickness of a plating layer which is formed on the substrate can be altered by rotating the substrate.

FIG. 13 illustrates the substrate 204 with a plating layer 208 formed on the lower face 206 of the substrate 204 as hereinbefore described. In the absence of rotation of the substrate 204, it is assumed for discussion purposes only, that the plating layer tends to form to a non-uniform thickness having a profile in cross section as illustrated by the dotted line 210. The plating layer will therefore tend to form thicker in the central region 134A, thinner in the outer region 136A, and again thicker in the edge region 138A.

Figure 14:
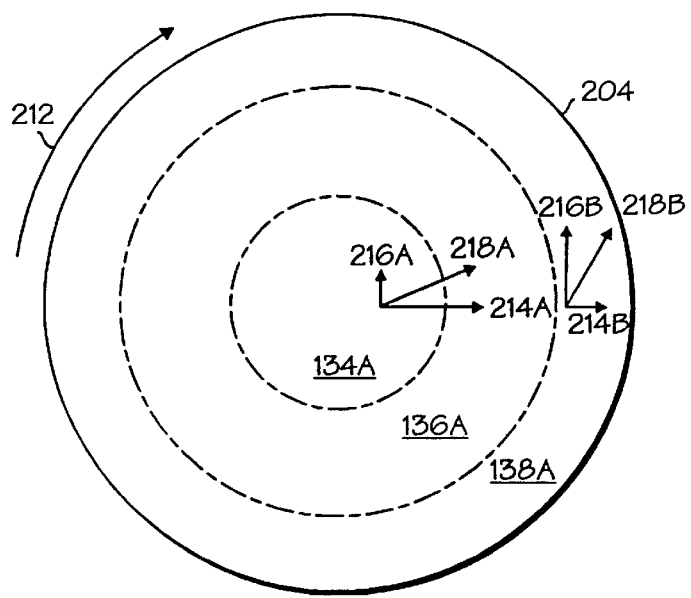
FIG. 14 is a bottom of the substrate of FIG. 12, illustrating how the velocity of the plating solution tends to reduce as the plating solution flows concentrically outwardly over the substrate, and how rotation of the substrate can counteract the tendency for the plating solution to lose velocity.

FIG. 14 is a view from below the substrate 204 when rotated in a clockwise direction 212. The central, outer and edge regions 134A, 136A and 138A are indicated between phantom lines.

As mentioned, the plating solution is deflected against the central region 134A and then flows concentrically outwardly over the outer region 136A and then over the edge region 138A. The plating solution tends to lose velocity in an outward direction due to the concentric flow pattern. The plating solution therefore has an outward velocity 214A when flowing over a point of the central region 134A, and an outward velocity 214B when flowing over a point in the edge region 138A, wherein the outward velocity 214B is less than the outward velocity 214A.

One factor which may contribute to a non-uniformity in thickness of the plating deals with lack of agitation and subsequent replacement of the plating solution after the plating solution has become depleted. The lower face 206 of the substrate 204 is initially exposed to a concentration and chemical composition of the plating solution substantially the same as the plating solution throughout the tank 66A. Once plating is initiated the plating solution near the substrate starts losing molecules to the plating layer being formed. The result of the loss of molecules is that a thin boundary layer of depleted plating solution forms on the lower face 206 of the substrate 204. The effect of the boundary layer of depleted plating solution is that less plating occurs as what could be achieved with undepleted plating solution, thus reducing the rate of plating on the lower face 206 of the substrate 204. The reduction in outward velocity of the plating solution results in less agitation of the plating solution as it flows outwardly. Less agitation of the plating solution, in turn, results in less replacement of the boundary layer of depleted plating solution with undepleted plating solution, thus resulting in less plating on the outer region 138A and especially on the edge region 138B than could be achieved with an undepleted plating solution.

Outer regions of the substrate 204 move faster relative to the plating solution due to rotation of the substrate 204. The plating solution therefore has a tangential velocity 216A over the substrate 204 at a point in the central region 134A, and a tangential velocity 216B over the substrate 204 at a point on the edge region, wherein the tangential velocity 216B is larger than the tangential velocity 216A.

The relatively large outward velocity 214A and the relatively small tangential velocity 216A add to a resultant velocity 218A. Similarly, the relatively small outward velocity 214B and the relatively large tangential velocity 216B add to a resultant velocity 218B. It can be seen therefore from the resultant velocities 218A and 218B of the plating solution over the substrate 204 that the magnitude of the velocity of the plating solution in the outer and edge regions of the substrate 204 is increased and that the direction of flow of the plating solution is altered.

By appropriately selecting the rotation speed of the substrate 204 with respect to the flow rate of the plating solution, the resultant velocities 218A and 218B can, for example, be controlled so as to be substantially equal.

By increasing the velocity of the plating solution in the outer and edge regions, more agitation of the plating solution will occur as the plating solution flows concentrically outwardly. More agitation of the plating solution, in turn, results in more replacement of depleted plating solution. An expected profile of the plating layer where formed while rotating the substrate 204 is indicated by the solid line 220 in FIG. 14. The plating layer forms more or less as thick in the central region 134 as when the substrate 204 is not rotated. The plating layer forms slightly thicker in the outer region 136A than when the substrate 204 is not rotated. The plating layer 208 forms even thicker in the edge region 138A than when the substrate 204 is not rotated.

A substrate may continuously be revolved in a single direction or may in a rotational sense be oscillated back and forth.

For example, back and forth oscillation of the substrate 160 of FIG. 10 may be preferred for purposes of proper agitation by the plating solution. By continuously reversing the direction of rotation, the plating solution is prevented from rotating with the substrate with correspondingly less agitation of the plating solution. Back and forth oscillation may also be preferred for purposes of plating on the elongate spring components 168 of FIG. 10. By oscillating the substrate 160, the plating solution flows back and forth over the elongate components 168, thereby ensuring more uniform plating on all sides of the elongate components 168.

On the other hand, a substrate may preferably be revolved when there is non-uniform distribution of plating solution or electric field over the substrate. For example, should the plating solution not be directed exactly orthogonally onto the substrate 204 of FIG. 12, more plating solution may, for example, flow towards the left over the lower face 206 of the substrate than towards the right over the lower face 206 of the substrate 204. By revolving the substrate 204, the lower face 206 of the substrate 204 is more uniformly exposed to the plating solution.

In another example, it may be possible, due to the electrical characteristics of the biasing device 72A, that the plating layer forms faster on one side of the lower face 206 of the substrate 204 than on another. By revolving the substrate, opposing sides of the lower face 206 may be equally exposed to the electrical plating conditions created.

Revolving and oscillation of the substrate 204 are preferably combined to ensure both proper agitation of the plating solution and equalization of plating. For example, the substrate may be rotated forward by about 5°, backward by about 3°, forward by about 5° etc.

EXAMPLE 2

In one example, the lower face 206 of the substrate 204 has an area exposed to the plating solution of 2.5 cm by 2.5 cm. The plating solution has a flow rate of 1 liter per minute. The substrate 204 is rotated at 0.3 rpm. An increase in plating near an edge of the substrate of 3% is noticed for otherwise similar conditions when the substrate 204 is not rotated.

Controlling Plating Over a Face of a Substrate by the Combined Use of a Temperature Gradient and Rotation of the Substrate It may, depending on plating requirements, be necessary or advantageous to tailor or control plating over a face of a substrate by the combined use of a temperature gradient and rotation of the substrate as hereinbefore described.

As previously mentioned, by revolving a substrate more uniform distribution of plating solution and electrical characteristics may be obtained, and by oscillating a substrate more agitation of a plating solution may be obtained. On the other hand, by controlling or tailoring plating over the width of a substrate by merely rotating the substrate may not lead to entirely satisfactory results. For example, with reference to FIG. 14, a comparison of the solid line profile 220 with the profile indicated by the dotted line 210 show that the overall thickness of plating cannot be reduced by merely rotating a substrate. Moreover, the solid line profile 220 cannot be as accurately controlled as when a temperature gradient is created (see for example the plating layer 144 of FIG. 8). A comparison of Examples 1 and 2 also shows that more tailoring can generally be obtained by creating a temperature gradient than by rotation.

Figure 15:
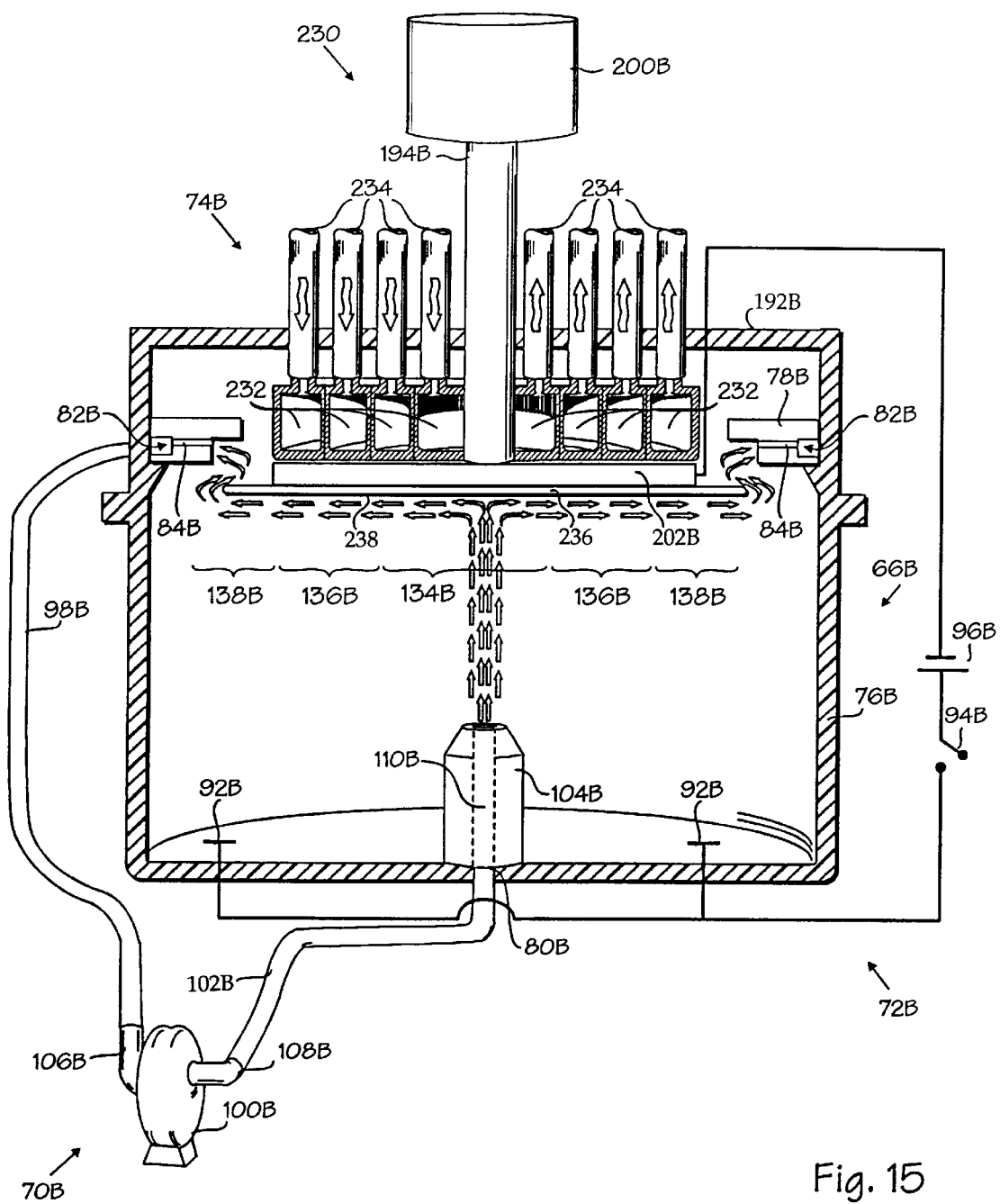
FIG. 15 is a sectioned side view of a plating system according to a further embodiment of the invention, wherein a thickness of a plating layer formed on a substrate is controlled collectively by rotating the substrate and by creating a temperature gradient.

What may therefore be required is a plating system which, in use, creates a temperature gradient over a substrate and also alters flow over the substrate by, for example, rotating the substrate. FIG. 15 shows a plating system 230 which combines the use of localized heating of a substrate with rotation of the substrate in order to tailor or control plating over a face of the substrate.

The plating system 230 includes a tank 66B for containing a plating solution, circulation apparatus 70B for the plating solution, an electrical biasing device 72B, an electric motor 200B, a rotatable shaft 194B, a substrate holder 202B, and a temperature control device 74B.

As with the embodiment of FIG. 12, the tank 66B includes a bucket 76B, a ring 78B near a brim of the bucket, and a lid 192B on the bucket 76B. The bucket has an inlet port 80B in a base thereof. The ring 78B also defines a volute 82B and has multiple outlet ports 84B formed therein.

The circulation apparatus 70B also includes a first pipe 98B, a pump 100B having a low pressure side 106B and a high pressure side 108B, a second pipe 102B, and a nozzle 104B having a vertical passage 110B therethrough.

The electrical biasing device 72B also has anodes 92B in a base of the bucket 76B, an electric switch 94B, and a power supply 96B having a terminal which is connected to the substrate holder 202B.

The temperature control device 74B includes a number of tubular thermal bladders 232 and a number of flexible pipes 234 connected to valves on the bladders 232.

The bladders are located one around the other around the shaft 194B. Once the substrate holder 202B is secured to the shaft 194B, the bladders are located on an upper surface of the substrate holder 202B. The flexible pipes 234 extend through holes in the lid 192B and form part of temperature control circuits including pumps and heat exchangers such as illustrated in FIG. 4.

In use, a substrate 236 is secured to the substrate holder 202B and the lid 192B is located on the bucket 76B so as to immerse the substrate 236 into the plating solution in the bucket 76B. The plating solution is then directed onto a central area 134B on the lower face 238 of the substrate 236, from where the plating solution flows over outer and edge regions, 136B and 138B, of the lower face 238 of the substrate 236.

A heat transfer medium is then circulated, as hereinbefore described with reference to FIG. 4, in order to create a temperature gradient on an upper surface of the substrate holder 202B. The substrate holder 202B is preferably relatively thin and conductive so that the temperature gradient is substantially reflected on a lower surface of the substrate holder 202B. The substrate 236 is preferably also relatively thin and conductive so that the temperature gradient is also substantially reflected on the lower face 238 of the substrate 236.

The electric motor 200B is then operated so as to oscillate the substrate holder 202B back and forth in a rotational sense. Since the bladders 232 are located on the substrate holder 202B, the bladders also oscillate back and forth in a rotational sense. Oscillation of the bladders 232 is allowed for by bending and movement of the flexible pipes 234. The substrate is preferably also progressively revolved while being oscillated.

The electric switch 94B can then be closed to initiate plating on the lower face 238 of the substrate 236.

Plating on the lower face of the substrate 236 is controlled jointly by the effects of rotation of the substrate 236 and the creation of a temperature gradient over the lower face 238 of the substrate 236. The relative effects of rotation and the creation of the temperature gradient may be altered relative to one another in order to obtain certain predetermined plating results.

While certain exemplary embodiments have been described and shown in the accompanying drawings, it is to be understood that such embodiments are merely illustrative and not restrictive of the current invention, and that this invention is not restricted to the specific constructions and arrangements shown and described, since modifications may occur to those ordinarily skilled in the art.

What is claimed:

1. A method of plating on a substrate, the method including:

exposing a first face of the substrate to a plating solution;
   directing the plating solution onto a first region of the first face of the substrate, the plating solution flowing over the first region, from where the plating solution flows over a second region of the first face, wherein the direction of flow of the plating solution over the first face of the substrate in the second region is changed with respect to the direction of flow of the plating solution over the first face of the substrate in the first region; and
   plating on the substrate utilizing a technique selected from the group consisting of electroplating and electroless plating.

2. The method of claim 1 wherein the velocity of the plating solution in the second region is increased due to the change in direction of the plating solution.

3. The method of claim 1 wherein flow of the plating solution between the first and second regions is changed by increasing a tangential component about the first region of flow of the plating solution.

4. The method of claim 1 wherein the said direction of flow of the plating solution over the second region is changed by rotating the substrate.

5. The method of claim 4 wherein the substrate is rotated about the first region.

6. The method of claim 4 wherein the substrate is rotationally oscillated.

7. The method of claim 1 which includes the step of creating a temperature gradient over the substrate.

8. The method of claim 7 wherein an area of a second face of the substrate opposing the first face is cooled.

9. The method of claim 7 wherein an area of a second face of the substrate opposing the first face is heated.

10. The method of claim 7 wherein a temperature of a first area of a second face of the substrate opposing the first face is altered to a first level, and a temperature of a second area of the second face is altered to a second level which is different to the first level.

11. The method of claim 10 wherein the first area is cooled and the second area is heated.

12. The method of claim 10 wherein the first and second areas are heated.

13. The method of claim 12 wherein the plating solution flows faster over the first region than over the second region.

14. The method of claim 13 wherein the temperature gradient is created such that the first region is at a lower temperature than the second region.

15. The method of claim 7 wherein the temperature gradient is created by at least first and second thermal bladders, each bladder having an inlet opening through which a temperature control medium enters the bladder and an outlet opening through which the temperature control medium exits from the bladder.

16. The method of claim 15 which includes the step of circulating the temperature control medium through the bladder.

17. The method of claim 16 which includes the step of controlling the temperature of the temperature control medium.

18. The method of claim 16 wherein the plating solution is substantially the same as the temperature control medium.

19. A method of rigidifying a plurality of elongate components, each elongate component having an end which is connected to a first face of a substrate, the method including:

exposing the elongate components to a plating solution; and directing the plating solution onto a first region of the first face of the substrate and over some of the elongate components at the first region, from where the plating solution flows over a second region of the first face and over some of the elongate components at the second region, wherein the direction of flow of the plating solution over the first face of the substrate in the second region is changed with respect to the direction of flow of the plating solution over the first face of the substrate in the first region; and plating a layer on each elongate component utilizing the plating solution, wherein the respective layer rigidifies a respect elongate component.

20. The method of claim 19 wherein flow of the plating solution between the first and second regions is altered by increasing a tangential component about the first region of flow of the plating solution.

21. The method of claim 20 wherein the flow of the plating solution between the first and second regions is altered by rotating the substrate.

22. The method of claim 21 wherein the substrate is rotated about the first region.

23. A method of rigidifying a plurality of elongate components, each elongate component having an end which is connected to a first face of a substrate, the method including:

exposing the elongate components to a plating solution;

directing the plating solution onto a first region of the first face and over some of the elongate components at the first region, from where the plating solution flows over a second region of the first face and over some of the elongate components at the second region;

rotating the substrate relative to the plating solution; and plating a layer substantially on each elongate component utilizng the plating solution, wherein the respective layer rigidifies a respective elongate component.

24. The method of claim 23 wherein the substrate is rotated about the first region.

25. The method of claim 24 wherein the substrate is rotationally oscillated.

* * * * *